(12) United States Patent
Ichinohe et al.

(10) Patent No.: US 10,914,764 B2
(45) Date of Patent: Feb. 9, 2021

(54) BALANCE TYPE CURRENT SENSOR

(71) Applicant: Alps Alpine Co., Ltd., Tokyo (JP)

(72) Inventors: Kenji Ichinohe, Miyagi-ken (JP);
Hideaki Kawasaki, Miyagi-ken (JP);
Akira Takahashi, Miyagi-ken (JP);
Naoki Sakazume, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 68 days.

(21) Appl. No.: 16/512,798

(22) Filed: Jul. 16, 2019

(65) Prior Publication Data
US 2019/0339306 A1   Nov. 7, 2019

Related U.S. Application Data

(63) Continuation of application No. PCT/JP2018/002702, filed on Jan. 29, 2018.

(30) Foreign Application Priority Data

Feb. 2, 2017 (JP) ................................. 2017-017280

(51) Int. Cl.
*G01R 15/20* (2006.01)
(52) U.S. Cl.
CPC ................... *G01R 15/205* (2013.01)

(58) Field of Classification Search
None
See application file for complete search history.

(56) References Cited

U.S. PATENT DOCUMENTS

| 8,760,158 | B2 | 6/2014 | Ichinohe |
| 9,964,602 | B2 | 5/2018 | Takaki et al. |
| 2011/0221436 | A1* | 9/2011 | Ichinohe ................ G01R 33/09 324/252 |

* cited by examiner

*Primary Examiner* — Jas A Sanghera
(74) *Attorney, Agent, or Firm* — Brinks Gilson & Lione

(57) ABSTRACT

A magnetic balance type current sensor includes a plurality of coils and a magnetic detection element whose characteristics change depending on a magnetic field induced by a current to be measured. Each of the plurality of coils includes a coil wire section disposed on a surface located away from a reference plane, a lead wire section connected to the coil wire section, and two electrode sections connected individually to the coil wire section and to the lead wire section. Each of the plurality of coils is capable of generating a canceling magnetic field when a feedback current is passed by using the electrode sections. The lead wire sections and the coil wire sections have crossing portions in which the lead wire sections and the coil wire sections are layered with an insulating section interposed so as to overlap each other in a winding axis direction of the coil wire sections.

8 Claims, 10 Drawing Sheets

BALANCE TYPE CURRENT SENSOR

CLAIM OF PRIORITY

This application is a Continuation of International Application No. PCT/JP2018/002702 filed on Jan. 29, 2018, which claims benefit of priority to Japanese Patent Application No. 2017-017280 filed on Feb. 2, 2017. The entire contents of each application noted above are hereby incorporated by reference.

BACKGROUND

1. Field of the Disclosure

The present disclosure relates to a balance type current sensor that includes a magnetic sensor and a feedback coil.

2. Description of the Related Art

International Publication No. 2012/011306 (hereinafter referred to as Patent Literature) discloses a current sensor that includes a magnetic detection element, a plurality of coils, and a switch circuit. The characteristics of the magnetic detection element change depending on a magnetic field induced by a current to be measured. The plurality of coils are connected in series and disposed in the vicinity of the magnetic detection element. A feedback current flows through the plurality of coils, and thus the plurality of coils generate a canceling magnetic field that cancels out the induced magnetic field. The switch circuit selects from the plurality of coils one or more coils to be electrically connected to the input terminal and/or the output terminal for the feedback current and controls coils through which the feedback current is passed. In this current sensor, a magnetic balance coil (feedback coil), which is divided into two or more portions, is provided, and each portion is used in combination with another portion in accordance with the amount of current to be measured. In this way, a relation ratio between the coil current and the generated magnetic field can be controlled, and highly accurate measurement and low power consumption over a wide measurement range can be realized. In addition, space saving can be realized (Patent Literature).

In such a magnetic balance type current sensor as is disclosed in Patent Literature, the strength of the magnetic field generated by the feedback coil can be switched between two levels by switching the switch circuit. However, the necessity of a switch circuit causes difficulty in terms of miniaturizing a current sensor.

In addition, such a magnetic detection element as is described above is formed on a wafer by using thin-film deposition processes, such as plating and sputtering, but Patent Literature presents neither a proposal concerning a way to respond to the requirement of various measurement ranges without increasing the number of mask patterns for a wafer nor a proposal concerning a configuration, such as wiring for a feedback coil, that can miniaturize a coil.

The present invention provides a magnetic balance type current sensor that has a plurality of feedback coils such as are disclosed in Patent Literature and that is capable of efficiently responding to various requirements concerning measurement ranges and the like.

SUMMARY

According to an aspect, there is provided a magnetic balance type current sensor that includes a magnetic detection element and a plurality of coils. The characteristics of the magnetic detection element change depending on an induced magnetic field induced by a current to be measured, and each of the plurality of coils includes a coil wire section disposed on a surface located away from a reference plane containing a sensitivity axis direction of the magnetic detection element. Each of the plurality of coils includes a lead wire section whose one end portion is connected to one end portion of the coil wire section, and each of the plurality of coils includes two electrode sections that are individually located at each end of each of the plurality of coils and that are electrically connected individually to the coil wire section and to the lead wire section. Each of the plurality of coils is capable of generating a canceling magnetic field that cancels out the induced magnetic field when a feedback current is passed by using the two electrode sections as an applying section. The lead wire sections and the coil wire sections have crossing portions in each of which one of the lead wire sections and one of the coil wire sections are layered with an insulating section interposed so as to overlap each other in a first direction, which is a winding axis direction of the coil wire sections. The two electrode sections are located outside envelope curves of the coil wire sections when viewed in the first direction.

In the magnetic balance type current sensor configured as above, selecting one of the plurality of coils or combining two or more coils of the plurality of coils as appropriate can provide a configuration of the magnetic balance type current sensor in which a plurality of kinds of feedback coils that have different strength ranges of canceling magnetic field can be chosen. Specifically, various feedback coils can be configured by changing connections among electrode sections of the plurality of coils and terminals of wiring lines for passing a feedback current.

In the above magnetic balance type current sensor, each of the plurality of coils includes electrode sections located outside the coil wire section. If an electrode section is an inside electrode section, which is located inside a coil wire section, wire bonding is performed to connect the inside electrode section to a terminal of a wiring line through which a feedback current is passed. If a bonding wire, which is bonded to the inside electrode section, is in contact with a coil wire section, the contact causes a short circuit. Thus, the area of the inside electrode section needs to be enlarged to a certain degree so as to avoid such inconvenience. Such an enlarged area of the inside electrode section results in an enlarged area of the entire coil wire section, leading to an impediment to miniaturization of a magnetic balance type current sensor. In contrast to this, as is the case for the magnetic balance type current sensor described above, if the electrode sections are located outside the coil wire sections, the areas of the coil wire sections can be reduced because it is unnecessary that the areas of the electrode sections be enlarged to avoid such inconvenience as is described above.

Consequently, when viewed in the first direction, the footprint of a coil can be reduced. Thus, the magnetic balance type current sensor described above is capable of efficiently handling various measurement ranges and is capable of responding to miniaturization.

DESCRIPTION OF THE EXEMPLARY EMBODIMENTS

Hereinafter, embodiments of the present invention will be described with reference to the drawings.

Figure 1:
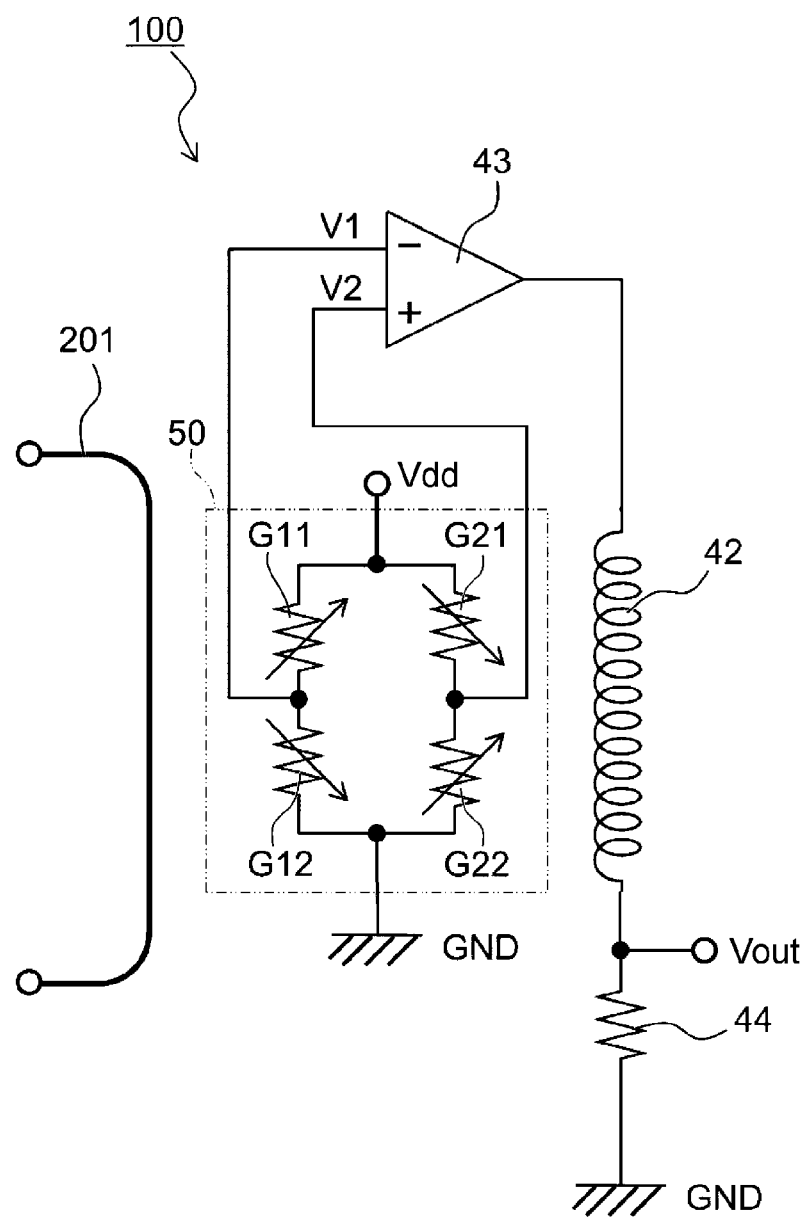
FIG. 1 is a circuit diagram conceptually illustrating a configuration of a magnetic balance type current sensor according to an embodiment of the present invention.
Figure 2:
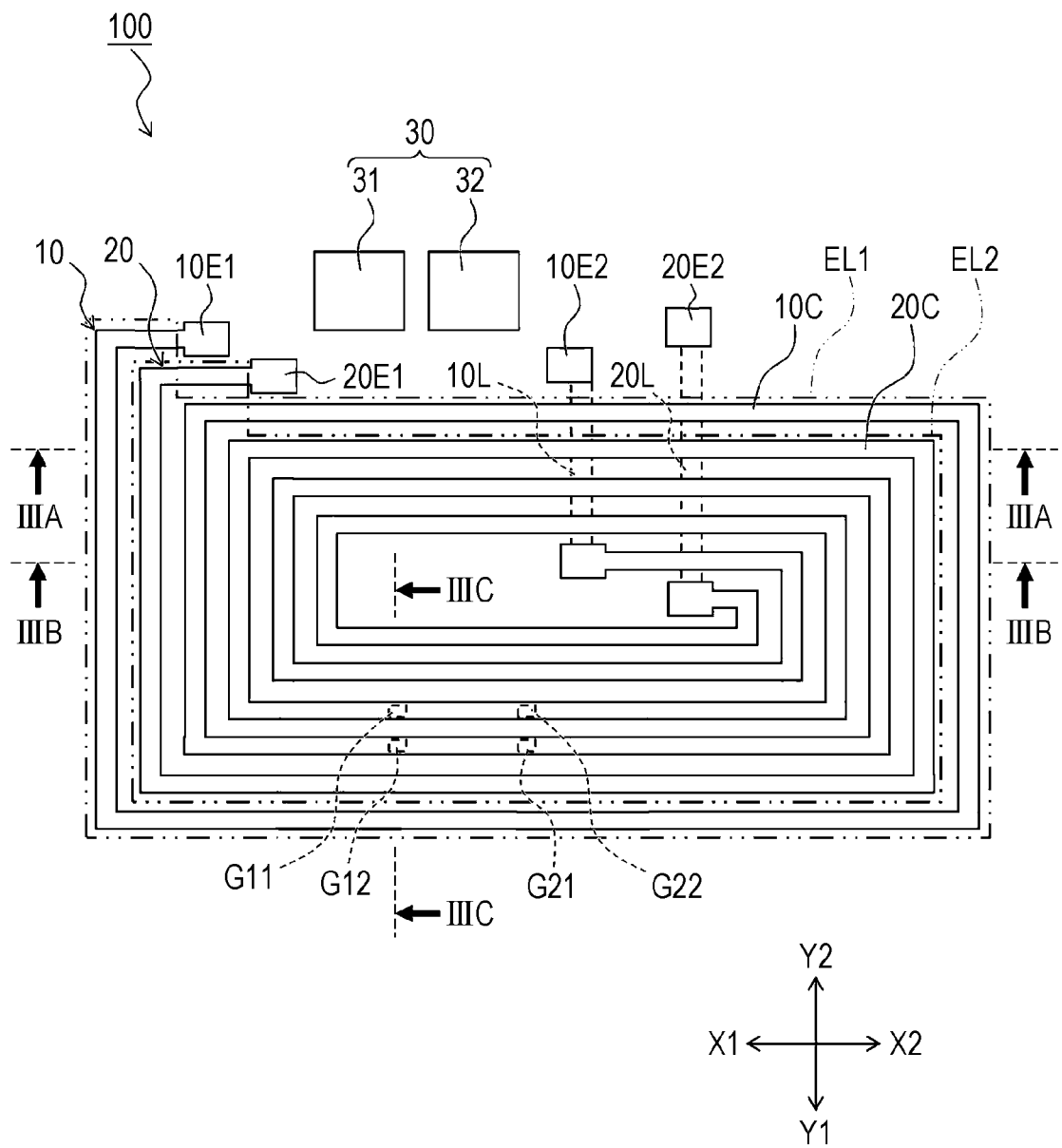
FIG. 2 is a top view conceptually illustrating a configuration of a magnetic balance type current sensor according to an embodiment of the present invention.
Figure 3A:
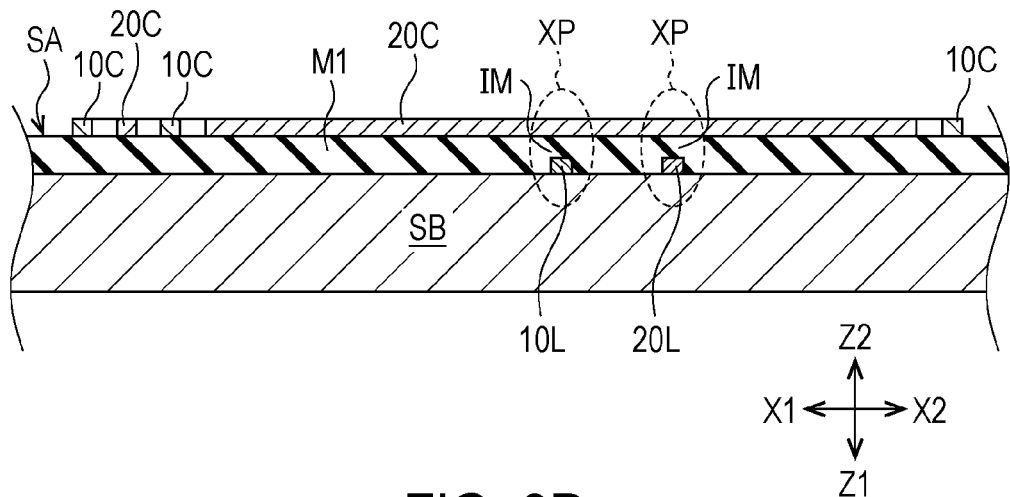
FIG. 3A is a cross-sectional view taken along line IIIA-IIIA of FIG. 2.
Figure 3B:
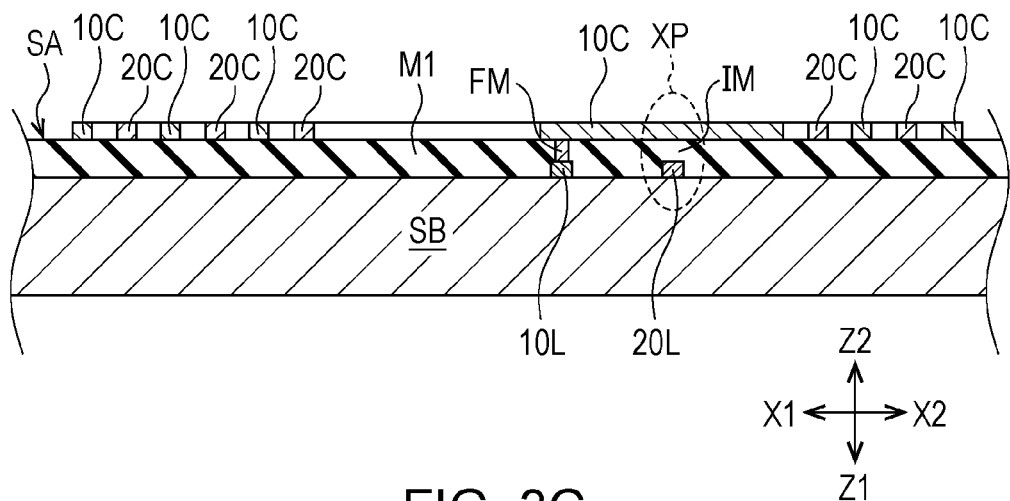
FIG. 3B is a cross-sectional view taken along line IIIB-IIIB of FIG. 2.
Figure 3C:
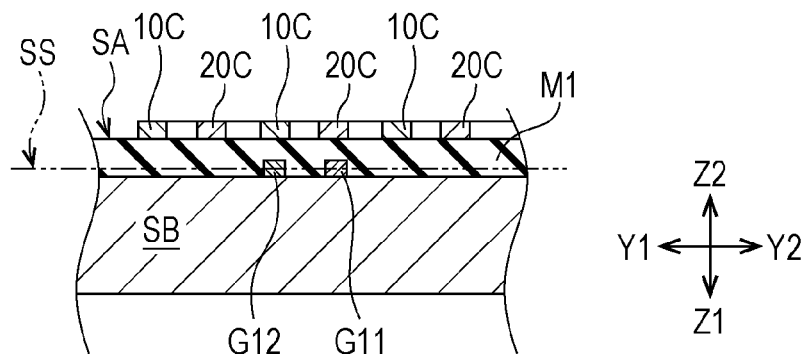
FIG. 3C is a cross-sectional view taken along line IIIC-IIIC of FIG. 2.

FIG. 1 is a circuit diagram conceptually illustrating a configuration of a magnetic balance type current sensor according to an embodiment of the present invention. FIG. 2 is a top view conceptually illustrating a configuration of a magnetic balance type current sensor according to an embodiment of the present invention. FIG. 3A is a cross-sectional view taken along line IIIA-IIIA of FIG. 2, FIG. 3B is a cross-sectional view taken along line IIIB-IIIB of FIG. 2, and FIG. 3C is a cross-sectional view taken along line IIIC-IIIC of FIG. 2.

A magnetic balance type current sensor 100 according to an embodiment of the present invention has a basic configuration as illustrated in FIG. 1. In this embodiment, four magnetic detection elements whose characteristics change depending on the magnetic field induced by a current to be measured are all magnetoresistance effect elements. A wiring line from an input terminal (Vdd) is connected to one end of each of two magnetoresistance effect elements G11 and G21, whose sensitivity axis directions are antiparallel to each other. One end of a magnetoresistance effect element G12 whose sensitivity axis direction is antiparallel to the sensitivity axis direction of the magnetoresistance effect element G11 is connected to the other end of the magnetoresistance effect element G11, and the other end of the magnetoresistance effect element G12 is grounded. Similarly, one end of a magnetoresistance effect element G22 whose sensitivity axis direction is antiparallel to the sensitivity axis direction of the magnetoresistance effect element G21 is connected to the other end of the magnetoresistance effect element G21, and the other end of the magnetoresistance effect element G22 is grounded. In this way, the four magnetoresistance effect elements G11, G21, G12, and G22 form a bridge circuit 50.

An output V1 from the node between the magnetoresistance effect element G11 and the magnetoresistance effect element G12 and an output V2 from the node between the magnetoresistance effect element G21 and the magnetoresistance effect element G22 are individually connected to each of the input terminals of an operational amplifier 43. The output of the operational amplifier 43 is connected to one end of a feedback coil 42, and a current flowing through the feedback coil 42 is controlled by the operational amplifier 43. The other end of the feedback coil 42 is grounded through a resistor 44, and the electric potential, which is relative to the ground terminal (GND), at the node between the resistor 44 and the feedback coil 42 is an output voltage Vout.

The operational amplifier 43 receives voltages that are input from the two outputs (V1 and V2) of the bridge circuit 50 and controls a voltage that is output to the feedback coil 42 so that the magnetic field induced by a current flowing through a wire to be measured 201 (current to be measured) and the magnetic field induced by a current flowing through the feedback coil 42 (also referred to as a "canceling magnetic field" in the present specification from the viewpoint of clearly indicating a difference from the magnetic field induced by the current to be measured) cancel each other out and the voltages that are input from the two outputs (V1 and V2) of the bridge circuit 50 are equal to each other.

Thus, the magnetic balance type current sensor 100 is a current sensor that employs a method of outputting the output voltage Vout, which correlates with a current to be measured. The method involves adjusting the amount of current of the feedback coil 42, which generates an induced magnetic field (canceling magnetic field) so as to cancel out the magnetic field induced by the current to be measured, and the adjustment is based on the detection values measured by the magnetic detection elements (magnetoresistance effect elements G11, G21, G12, and G22).

As is evident from the above measurement principle, the strength of the canceling magnetic field generated by the feedback coil 42 is required to be approximately equal to the strength of the magnetic field induced by the current to be measured. Accordingly, the strength of the canceling magnetic field needs to vary depending on the expected amount of current to be measured. To realize this, the structure of the feedback coil 42, specifically the number of turns and the distances from magnetic detection elements, is preferably changed. However, since the expected amount of current to be measured varies extensively, providing many kinds of configurations of the magnetic balance type current sensor 100, in each of which the feedback coil 42 has a different structure, in accordance with these various requirements is not always easy and is not effective, either, from an economic viewpoint.

As described below, the magnetic balance type current sensor 100 according to the embodiment of the present invention includes a plurality of coils so that the strength range of the canceling magnetic field induced by the feedback coil 42 can easily be changed.

As illustrated in FIG. 3C, the magnetic detection elements (magnetoresistance effect elements G11 and G12) are disposed on a substrate SB in the magnetic balance type current sensor 100. An insulating layer M1 is disposed so as to cover the magnetic detection elements (magnetoresistance effect elements G11 and G12). Similarly, the magnetoresistance effect elements G21 and G22 are also disposed on the substrate SB, and the insulating layer M1 is disposed so as to cover the magnetoresistance effect elements G21 and G22.

As illustrated in FIG. 2 and FIGS. 3A, 3B, and 3C, the magnetic balance type current sensor 100 includes two coils 10 and 20. As illustrated in FIG. 3C, the two coils 10 and 20 have spiral-shaped coil wire sections 10C and 20C, respectively, and the coil wire sections 10C and 20C are disposed on a surface SA located away from a reference plane SS (specifically, the surface SA is the Z2-side surface of the insulating layer M1 in the Z1-Z2 direction). The reference plane SS contains the sensitivity axis direction (Y1-Y2 direction) of the magnetic detection elements (magnetoresistance effect elements G11, G21, G12, and G22). In the magnetic balance type current sensor 100, the two coil wire sections 10C and 20C are both located on the same surface (the surface SA). As illustrated in FIG. 2, the magnetoresistance effect elements G11, G21, G12, and G22 are placed so as to overlap the coil wire section 10C or the coil wire section 20C when viewed in a first direction (Z1-Z2 direction), which is the winding axis direction of the coil wire sections 10C and 20C. This arrangement causes the direction of the canceling magnetic field induced by the feedback coil 42, which is formed by the coils 10 and 20, to be readily aligned in the sensitivity axis direction (Y1-Y2 direction).

The two coils 10 and 20 include lead wire sections 10L and 20L, respectively. One end portion of each of the lead wire sections 10L and 20L is connected to one end portion of the corresponding one of the coil wire sections 10C and 20C. The lead wire sections 10L and 20L and the coil wire sections 10C and 20C have crossing portions XP in each of which one of the lead wire sections 10L and 20L and one of the coil wire sections 10C and 20C are layered with an insulating section IM interposed so as to overlap each other in the first direction (Z1-Z2 direction). FIG. 3A, which is a cross-sectional view taken along line WA-WA, illustrates two crossing portions XP, and FIG. 3B, which is a cross-sectional view taken along line IIIB-IIIB, illustrates one crossing portion XP. In the magnetic balance type current sensor 100, the lead wire sections 10L and 20L are disposed on the Z2-side surface of the substrate SB in the Z1-Z2 direction. The coil wire section 10C disposed on the surface SA, which is on the Z2 side of the insulating layer M1 in the Z1-Z2 direction, and the lead wire section 10L are connected to each other by using a conductive material FM with which a through hole provided in the insulating layer M1 is filled.

Two electrode sections 10E1 and 10E2, which are electrically connected to the coil wire section 10C and the lead wire section 10L, respectively, are individually disposed at each end of the coil 10. The two electrode sections 10E1 and 10E2 are located outside the envelope curve EL1 of the coil wire section 10C when viewed in the first direction (Z1-Z2 direction). Similarly, two electrode sections 20E1 and 20E2, which are electrically connected to the coil wire section 20C and the lead wire section 20L, respectively, are individually disposed at each end of the coil 20. The two electrode sections 20E1 and 20E2 are located outside the envelope curve EL2 of the coil wire section 20C when viewed in the first direction (Z1-Z2 direction).

The magnetic balance type current sensor 100 includes an output/input terminals 30. A wiring line (not shown) from the output of the operational amplifier 43 is connected to an input terminal 31, which is one terminal of the output/input terminals 30, and a wiring line (not shown) that leads to the resistor 44 is connected to an output terminal 32, which is the other terminal of the output/input terminals 30.

When the magnetic balance type current sensor 100 is used, connections between the electrode sections 10E1, 10E2, 20E1, and 20E2 of the coils 10 and 20 and the output/input terminals 30 (the input terminal 31 and the output terminal 32) are established as appropriate, and thus, as described below, a plurality of kinds of configurations of the feedback coil 42 that have different strength ranges of canceling magnetic field can be obtained even when the same voltage is applied.

Figure 4A:
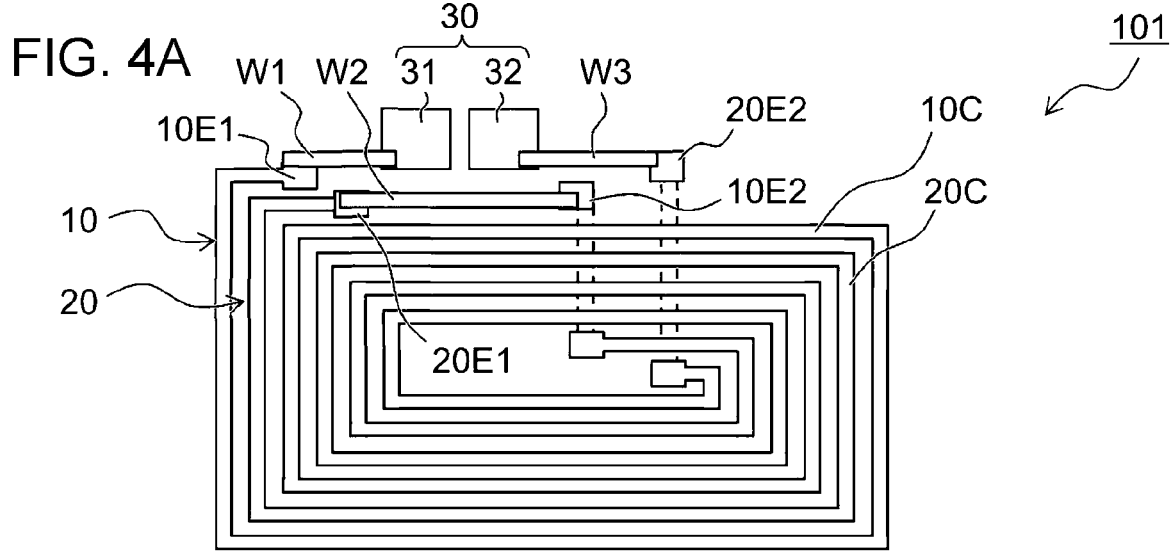
FIGS. 4A, 4B, and 4C provide top views illustrating example use conditions of the magnetic balance type current sensor according to the embodiment of the present invention and illustrate conditions of series connection in FIG. 4A, parallel connection in FIG. 4B, and single coil use in FIG. 4C.
Figure 4B:
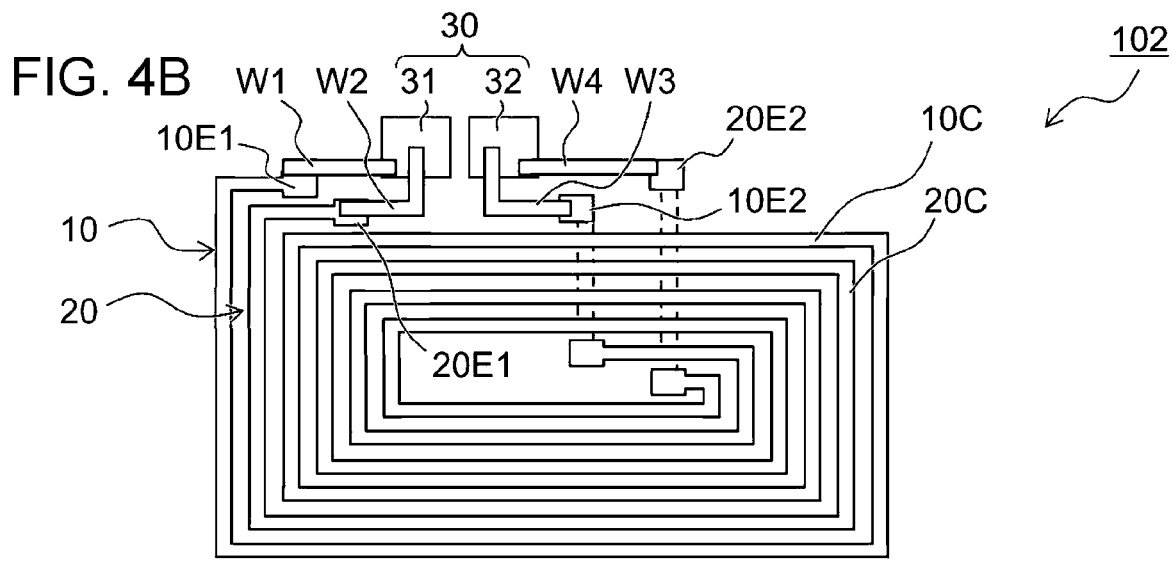
Figure 4C:
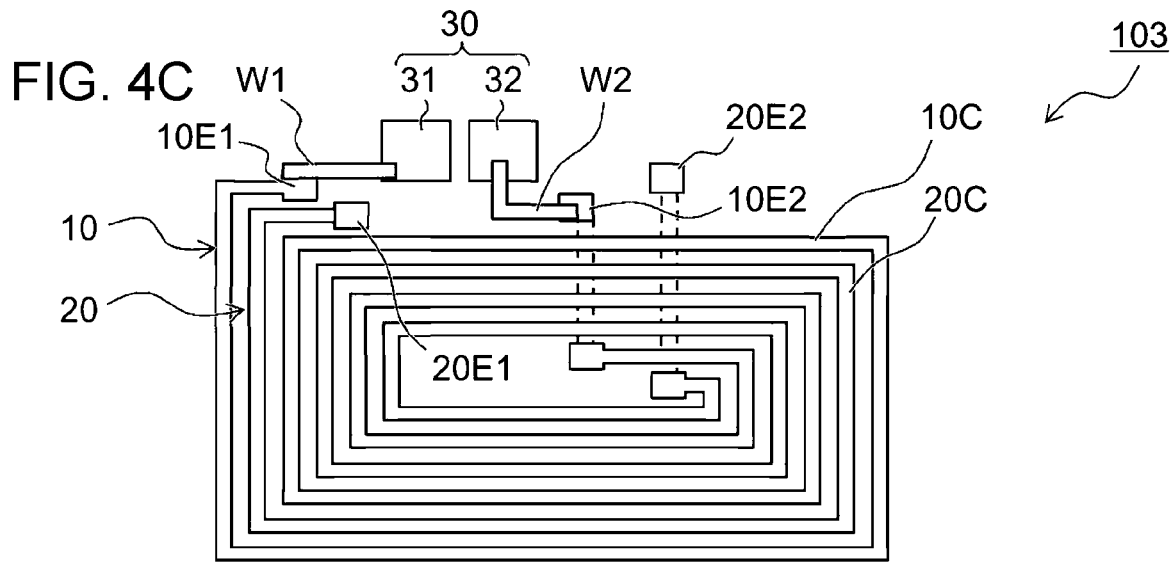

FIGS. 4A, 4B, and 4C provide top views illustrating example use conditions of the magnetic balance type current sensor according to the embodiment of the present invention and illustrate conditions of series connection in FIG. 4A, parallel connection in FIG. 4B, and single coil use in FIG. 4C.

As illustrated in FIG. 4A, the electrode section 10E1, which is located at one end of the coil 10, is connected to the input terminal 31 by using a wiring line W1, the electrode section 10E2, which is located at the other end of the coil 10, is connected to the electrode section 20E1, which is located at one end of the coil 20, by using a wiring line W2, and the electrode section 20E2, which is located at the other end of the coil 20, is connected to the output terminal 32 by using a wiring line W3. These connections provide a magnetic balance type current sensor 101 that includes the feedback coil 42, which has a configuration in which the coil wire section 10C and the coil wire section 20C are connected in series.

As illustrated in FIG. 4B, the electrode section 10E1, which is located at one end of the coil 10, is connected to the input terminal 31 by using a wiring line W1, the electrode section 20E1, which is located at one end of the coil 20, is connected to the input terminal 31 by using a wiring line W2, the electrode section 10E2, which is located at the other end of the coil 10, is connected to the output terminal 32 by using a wiring line W3, and the electrode section 20E2, which is located at the other end of the coil 20, is connected to the output terminal 32 by using a wiring line W4. These connections provide a magnetic balance type current sensor 102 that includes the feedback coil 42, which has a configuration in which the coil wire section 10C and the coil wire section 20C are connected in parallel.

As illustrated in FIG. 4C, the electrode section 10E1, which is located at one end of the coil 10, is connected to the input terminal 31 by using a wiring line W1, the electrode section 10E2, which is located at the other end of the coil 10, is connected to the output terminal 32 by using a wiring line W2. These connections provide the magnetic balance type current sensor 100, which is in a configuration in which only the coil 10 is used. Although not illustrated, the electrode section 20E1, which is located at one end of the coil 20, is connected to the input terminal 31 by using a wiring line W1, and the electrode section 20E2, which is located at the other end of the coil 20, is connected to the output terminal 32 by using a wiring line W2. These connections provide a magnetic balance type current sensor 103 that includes the feedback coil 42, which has a configuration in which only the coil 20 is used.

When the voltage applied to the input terminal 31 is the same, the strength of the magnetic field (canceling magnetic field) induced by the feedback coil 42 in the case of the series connection illustrated in FIG. 4A, the strength of the canceling magnetic field in the case of the parallel connection illustrated in FIG. 4B, and the strength of the canceling magnetic field in the case of using only the coil 10 as illustrated in FIG. 4C differ from each other. If different resistivity is adopted for the coil wire section 10C and for the coil wire section 20C, a canceling magnetic field having different strength from the strength in the case of using only the coil 10 can be generated by using only the coil 20 and wire connections similar to the case illustrated in FIG. 4C.

If a coil wire section has a spiral shape, one end portion of the coil wire section is typically located inside the coil wire section, which is wound. In this way, if an electrode section is an inside electrode section, which is located inside a coil wire section, wire bonding is performed to connect the inside electrode section to a terminal of a wiring line through which a feedback current is passed. If a bonding wire, which is bonded to the inside electrode section, is in contact with a coil wire section, the contact causes a short circuit. Thus, the area of the inside electrode section needs to be enlarged to a certain degree so as to avoid such inconvenience. Such an enlarged area of the inside electrode section results in an enlarged area of the entire coil wire section, leading to an impediment to miniaturization of a magnetic balance type current sensor. In contrast to this, as is the case for the magnetic balance type current sensor 100 according to the present embodiment, if the electrode sections 10E1, 10E2, 20E1, and 20E2 are located outside the coil wire sections 10C and 20C (specifically, outside the envelope curves EL1 and EL2 of the coil wire sections 10C and 20C when viewed in the first direction (Z1-Z2 direction)), the areas of the coil wire sections 10C and 20C viewed in the first direction (Z1-Z2 direction) can be reduced because it is unnecessary that the areas of the electrode sections be enlarged to avoid such inconvenience as is described above. Thus, the magnetic balance type current sensor 100 according to the present embodiment is capable of efficiently handling various measurement ranges and is capable of responding to miniaturization. In addition, configurations of the magnetic balance type current sensor 100, which have various measurement ranges, can be produced only by changing connections of wiring lines W1, W2, W3, and W4 without changing patterns of the coils 10 and 20, the lead wire sections 10L and 20L, the electrode sections 10E1, 10E2, 20E1, and 20E2, and the like. Accordingly, when the configurations of the magnetic balance type current sensor 100, which have various measurement ranges, are formed on wafers, the number of mask patterns can be reduced, and efficient production is possible.

Figure 5:
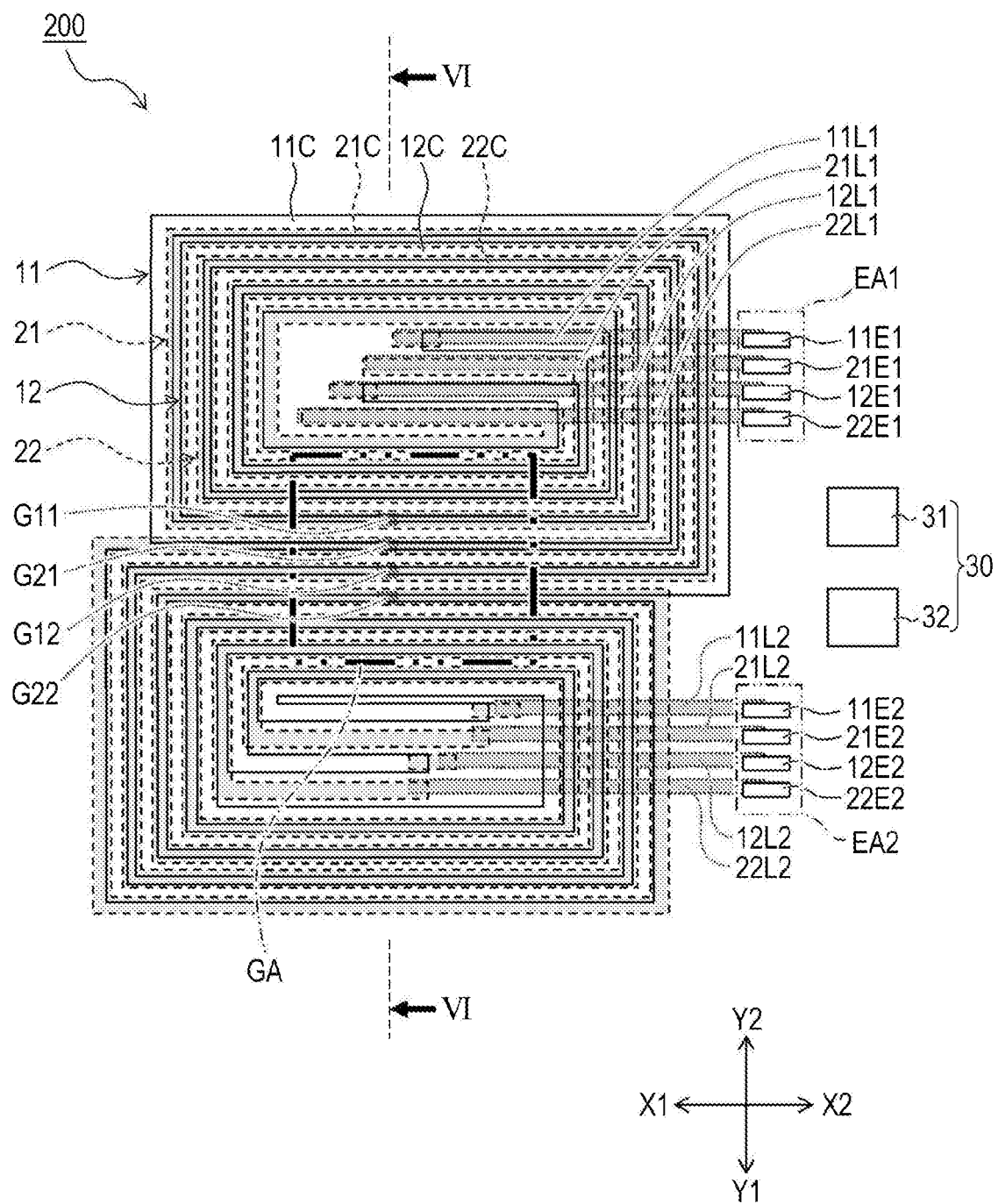
FIG. 5 is a top view conceptually illustrating a configuration of a magnetic balance type current sensor according to the other embodiment of the present invention.
Figure 6:
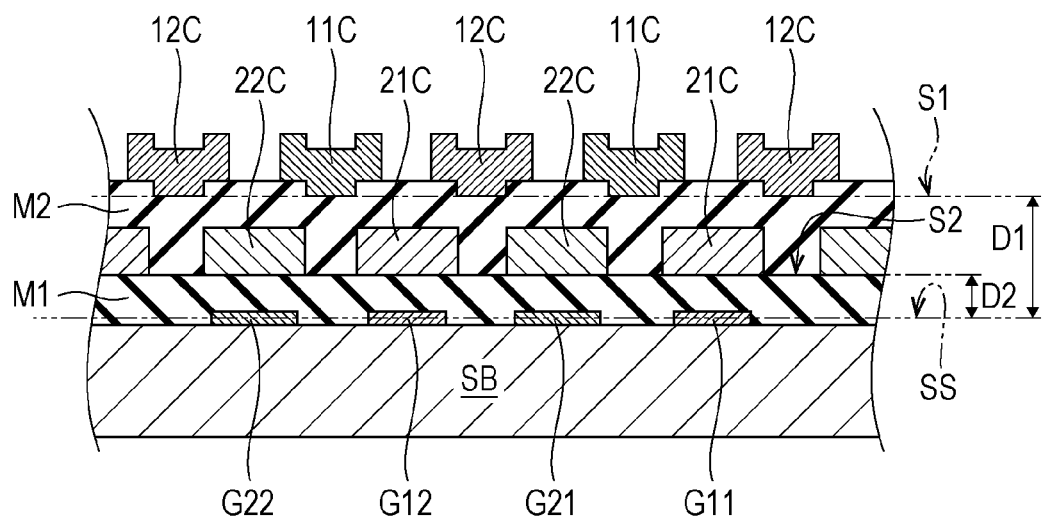
FIG. 6 is a partly sectioned view taken along line VI-VI of FIG. 5.
Figure 6:
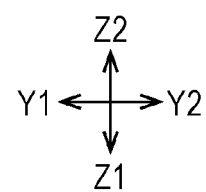
Figure 7:
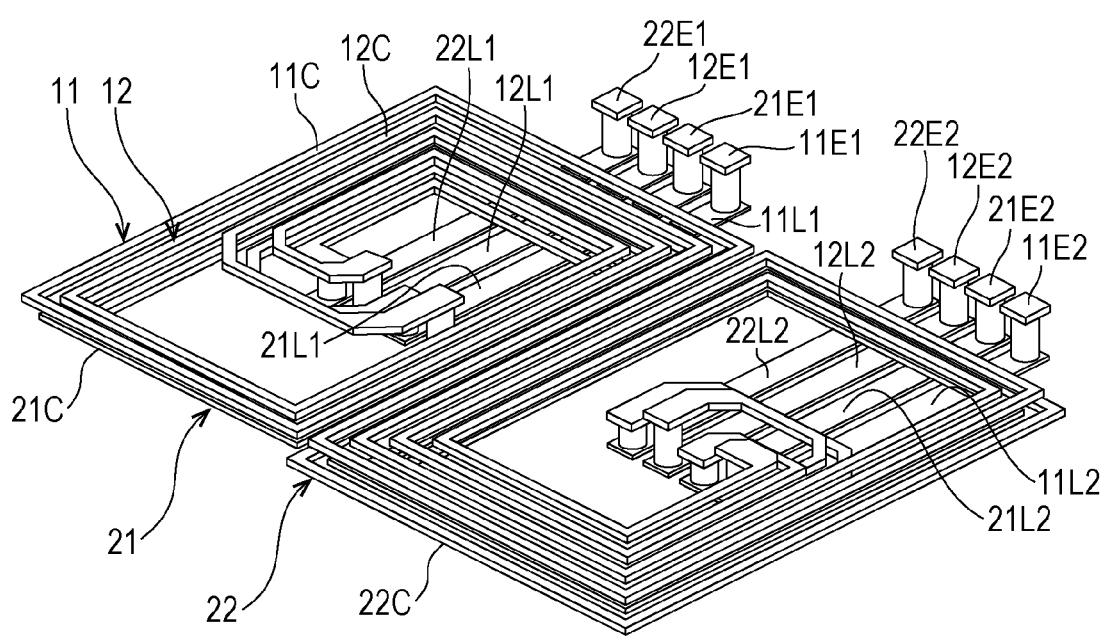
FIG. 7 is a perspective view conceptually illustrating an arrangement of four coils of a magnetic balance type current sensor that has a structure similar to the magnetic balance type current sensor according to the other embodiment of the present invention.
Figure 7:
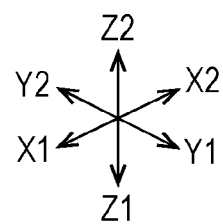

FIG. 5 is a top view conceptually illustrating a configuration of a magnetic balance type current sensor according to the other embodiment of the present invention. FIG. 6 is a partly sectioned view taken along line VI-VI of FIG. 5. Specifically, FIG. 6 is a cross-sectional view of a portion where magnetic detection elements are disposed. FIG. 7 is a perspective view conceptually illustrating an arrangement of four coils of a magnetic balance type current sensor that has a structure similar to the magnetic balance type current sensor according to the other embodiment of the present invention (magnetic balance type current sensor illustrated in FIGS. 5 and 6).

As illustrated in FIGS. 5 to 7, a magnetic balance type current sensor 200 according to the other embodiment of the present invention includes a plurality of coils as is the case for the magnetic balance type current sensor 100, but four coils are included. Specifically, as illustrated in FIG. 6, the magnetic balance type current sensor 200 includes a first coil group and a second coil group as two kinds of coil groups located at different distances from a reference plane SS. Further, the first coil group includes two coils (a first outside coil 11 and a first inside coil 12), and the second coil group also includes two coils (a second outside coil 21 and a second inside coil 22).

Coil wire sections 11C, 12C, 21C, and 22C of the coils each have so-called figure-of-eight winding, in which two spiral shapes (winding shapes) are connected to form a shape of Arabic numeral eight. Consequently, each of the coil wire sections 11C, 12C, 21C, and 22C has end portions located near the centers of spirals, and the end portions are individually connected to lead wire sections 11L1, 11L2, 12L1, 12L2, 21L1, 21L2, 22L1, and 22L2. Accordingly, electrode sections 11E1 and 11E2 of the first outside coil 11, electrode sections 12E1 and 12E2 of the first inside coil 12, electrode sections 21E1 and 21E2 of the second outside coil 21, and electrode sections 22E1 and 22E2 of the second inside coil 22 are located outside the envelope curves of the coil wire sections.

Specifically, all the electrode sections are located on the X2 side of the coil wire sections in the X1-X2 direction, arranged in the Y1-Y2 direction, and constitute electrode array sections EA1 and EA2. Two electrode sections selected from the plurality of electrode sections 11E1, 11E2, 12E1, 12E2, 21E1, 21E2, 22E1, and 22E2, which are placed side by side in the electrode array sections EA1 and EA2, are electrically connected to output/input terminals 30, and the remaining plurality of electrode sections are short-circuited as necessary, and a magnetic balance type current sensor having various measurement ranges can be obtained in this way.

As illustrated in FIG. 5, four magnetoresistance effect elements G11, G21, G12, and G22 are disposed in a region GA (indicated by the thick two-dot chain line in FIG. 5), in which two spiral shapes (winding shapes) are placed side by side and a generated canceling magnetic field is most likely to be oriented in the Y1-Y2 direction.

As illustrated in FIG. 6, in the magnetic balance type current sensor 200, the magnetoresistance effect elements G11, G21, G12, and G22 are formed on a substrate SB, an insulating layer M1 is formed on the magnetoresistance effect elements G11, G21, G12, and G22 and the substrate SB, and the coil wire sections 21C and 22C in the second coil group (the second outside coil 21 and the second inside coil 22) are formed on a surface (second surface) S2 of the insulating layer M1 on the Z2 side in the Z1-Z2 direction. An insulating layer M2 is formed so as to cover the coil wire sections 21C and 22C. The Z2-side surface of the insulating layer M2 in the Z1-Z2 direction is uneven due to an effect of the coil wire sections 21C and 22C. The coil wire sections 11C and 12C in the first coil group (the first outside coil 11 and the first inside coil 12) are formed so as to lie between the coil wire section 21C and the coil wire section 22C, which are disposed side by side when viewed in the first direction (Z1-Z2 direction). The coil wire sections 11C and 12C in the first coil group and the coil wire sections 21C and 22C in the second coil group are arranged alternately (staggered) in this way when viewed in the X1-X2 direction, and thus the orientation of the canceling magnetic field induced by a feedback coil 42 is easily aligned in the sensitivity axis direction (Y1-Y2 direction). As illustrated in FIG. 6, the surface on which the Z1 side surface of the coil wire sections 11C and 12C in the first coil group is located in the Z1-Z2 direction is a first surface S1.

The distance (first distance D1) between the reference plane SS and the first surface S1, on which the coil wire sections 11C and 12C in the first coil group (the first outside coil 11 and the first inside coil 12) are disposed, is larger than the distance (second distance D2) between the reference plane SS and the second surface S2, on which the coil wire sections 21C and 22C in the second coil group (the second outside coil 21 and the second inside coil 22) are disposed. Thus, when one coil in the first coil group (for example, the first outside coil 11) and one coil in the second coil group (for example, the second outside coil 21) are connected in series and a feedback current is passed, the strength of the canceling magnetic field that is exerted on the magnetic detection elements (magnetoresistance effect elements G11, G21, G12, and G22) by the one coil in the first coil group (first outside coil 11) is different from the strength of the canceling magnetic field that is exerted on the magnetic detection elements (magnetoresistance effect elements G11, G21, G12, and G22) by the one coil in the second coil group (second outside coil 21).

If common design rules (such as resistivity, cross-sectional area, the number of turns) are applied to the coil wire sections 11C, 12C, 21C, and 22C, the coil wire sections 11C, 12C, 21C, and 22C disposed on surfaces located at different distances from the reference plane SS in this way can cause the degree of effect that is exerted on the magnetic detection elements (magnetoresistance effect elements G11, G21, G12, and G22) by the canceling magnetic field induced by the coil wire sections 11C and 12C to differ from the degree of effect for the case of the coil wire sections 21C and 22C. Accordingly, the magnetic balance type current sensor 200, which has a compact and simple structure, can be set to realize various measurement ranges.

Figure 8A:
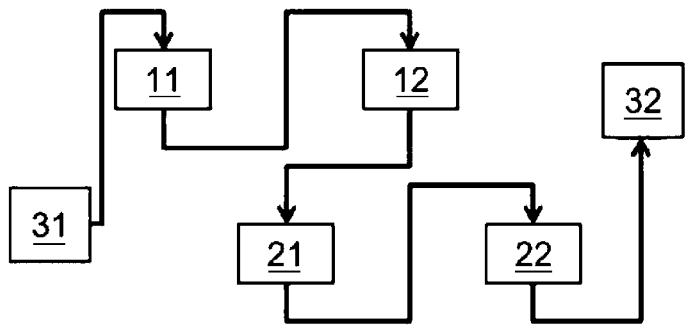
FIGS. 8A, 8B, and 8C provide block diagrams illustrating configurations under use conditions of the magnetic balance type current sensor according to the other embodiment of the present invention and illustrate conditions of all series connection in FIG. 8A, parallel-series connection in FIG. 8B, and series-parallel connection in FIG. 8C.
Figure 8B:
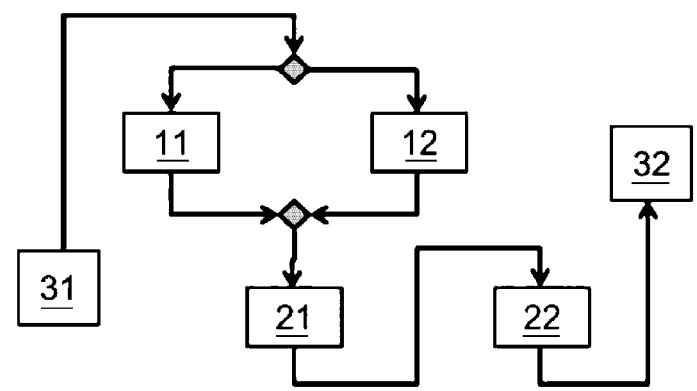
Figure 8C:
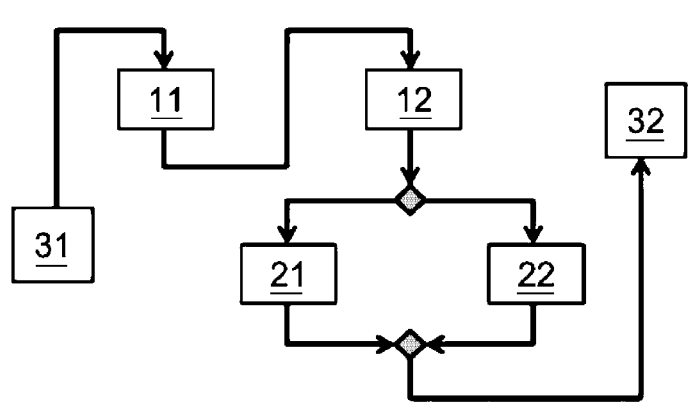
Figure 9A:
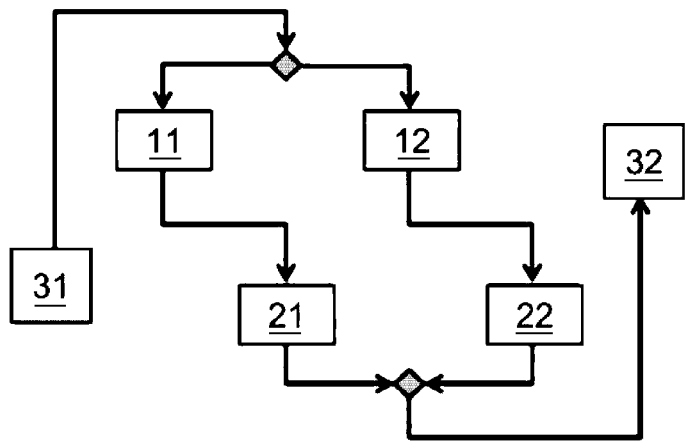
FIGS. 9A, 9B, and 9C provide block diagrams illustrating configurations under use conditions of the magnetic balance type current sensor according to the other embodiment of the present invention and illustrate conditions of parallel (series) connection in FIG. 9A, series connection in FIG. 9B, and parallel connection in FIG. 9C.
Figure 9B:
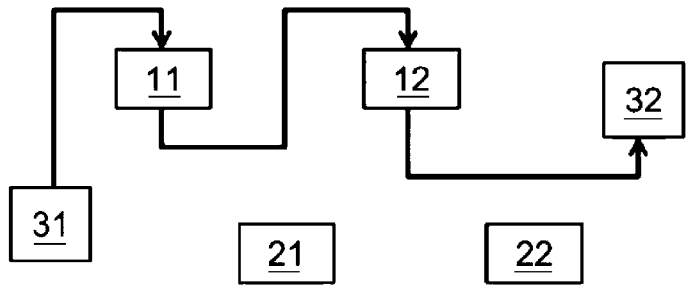
Figure 9C:
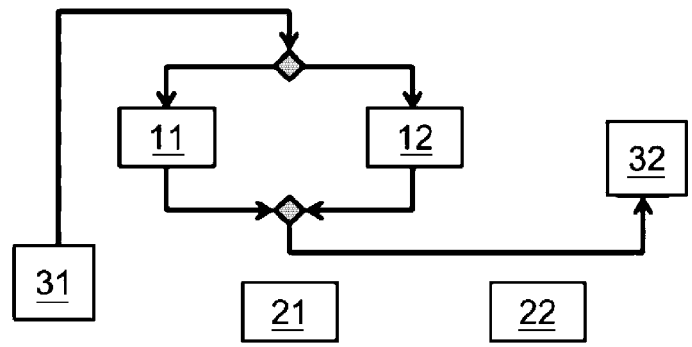

FIGS. 8A, 8B, and 8C provide block diagrams illustrating configurations under use conditions of the magnetic balance type current sensor 200 according to the other embodiment of the present invention and illustrate conditions of all series connection in FIG. 8A, parallel-series connection in FIG. 8B, and series-parallel connection in FIG. 8C. FIGS. 9A, 9B, and 9C provide block diagrams illustrating configurations under use conditions of the magnetic balance type current sensor 200 according to the other embodiment of the present invention and illustrate conditions of parallel (series) connection in FIG. 9A, series connection in FIG. 9B, and parallel connection in FIG. 9C.

In the magnetic balance type current sensor 200, as illustrated in FIG. 5, the electrode sections 11E1, 11E2, 12E1, 12E2, 21E1, 21E2, 22E1, and 22E2 of all the coils are located side by side near the output/input terminals 30 (an input terminal 31 and an output terminal 32), and changing connections between these electrode sections and the output/input terminals 30 is sufficient to provide various configurations of the feedback coil 42 that have different strength ranges of canceling magnetic field.

In the block diagram illustrated in FIG. 8A, the coil wire sections 11C, 12C, 21C, and 22C in all the coil groups are connected in series (all series connection). In the block diagram illustrated in FIG. 8B, the coil wire sections 11C and 12C in the first coil group are connected in parallel, followed by the coil wire sections 21C and 22C in the second coil group connected in series (parallel-series connection). In the block diagram illustrated in FIG. 8C, the coil wire sections 11C and 12C in the first coil group are connected in series, followed by the coil wire sections 21C and 22C in the second coil group connected in parallel (series-parallel connection).

In the block diagram illustrated in FIG. 9A, the coil wire section 11C of the first outside coil 11 and the coil wire section 21C of the second outside coil 21 are connected in series (first series connection), the coil wire section 12C of the first inside coil 12 and the coil wire section 22C of the second inside coil 22 are connected in series (second series connection), and the first series connection and the second series connection are connected in parallel (parallel (series) connection). In the block diagram illustrated in FIG. 9B, the coil wire section 11C of the first outside coil 11 and the coil wire section 12C of the first inside coil 12 are connected in series, and this series connection is connected to the input terminal 31 and to the output terminal 32 (series connection). In short, the second coil group is not used in this series connection. In the block diagram illustrated in FIG. 9C, the coil wire section 11C of the first outside coil 11 and the coil wire section 12C of the first inside coil 12 are connected in parallel, and this parallel connection is connected to the input terminal 31 and to the output terminal 32 (parallel connection). In short, the second coil group is not used in this parallel connection.

Figure 10:
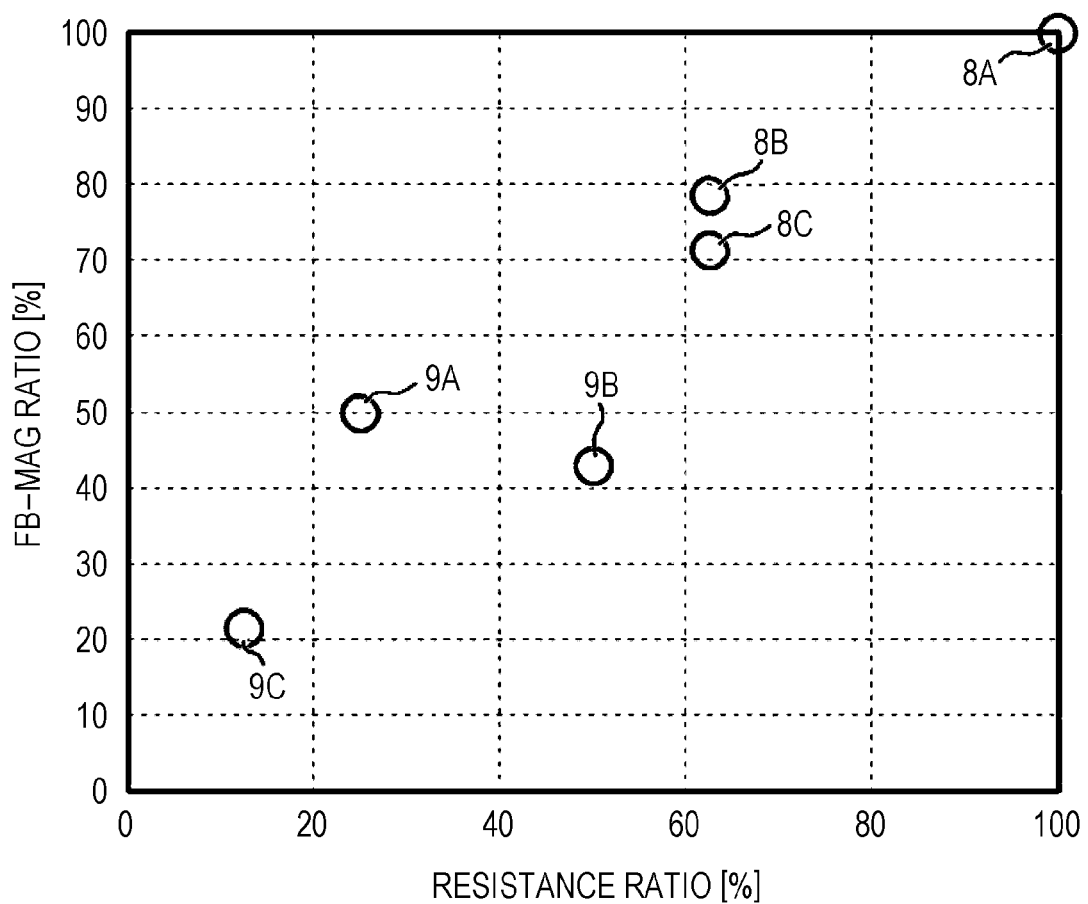
FIG. 10 is a graph illustrating a relation between magnetic field strength and resistance under use conditions of the magnetic balance type current sensor according to the other embodiment of the present invention.

Simulations were performed for the magnetic balance type current sensor 200, which includes the feedback coil 42 configured by using each of the six connections described above, and the resistance of the feedback coil 42 and the magnitude of the canceling magnetic field at the position of the sensitivity axis of the magnetic detection elements were obtained through the simulations. The results are illustrated in FIG. 10. The horizontal axis in FIG. 10 denotes the normalized resistance of the feedback coil 42 (Resistance Ratio, unit in %), which is obtained by dividing the resistance of the feedback coil 42 in each configuration by the resistance of the feedback coil 42 in the configuration represented by the block diagram illustrated in FIG. 8A, and the vertical axis in FIG. 10 denotes the normalized strength of the canceling magnetic field induced by the feedback coil 42 (Magnetic Field Strength Ratio, unit in %), which is obtained by dividing the strength of the canceling magnetic field induced by the feedback coil 42 in each configuration by the strength of the canceling magnetic field induced by the feedback coil 42 in the configuration represented by the block diagram illustrated in FIG. 8A. In FIG. 10, a symbol is attached to each data point to indicate which of the configurations of the feedback coil 42 represented by the block diagrams illustrated in FIGS. 8A, 8B, and 8C and FIGS. 9A, 9B, and 9C described above produced the result corresponding to the data point.

As illustrated in FIG. 10, canceling magnetic fields varying in strength can be induced by changing connections of the coil wire sections 11C and 12C in the first coil group and the coil wire sections 21C and 22C in the second coil group to the output/input terminals 30 (the input terminal 31 and the output terminal 32). In particular, the resistance of the feedback coil 42 in the configuration represented by the block diagram illustrated in FIG. 8B is equal to the resistance of the feedback coil 42 in the configuration represented by the block diagram illustrated in FIG. 8C (Resistance Ratio being 63%). But the canceling magnetic fields are different in strength (Magnetic Field Strength Ratios being 78.6% and 71%) because the distance (first distance D1) between the first surface S1 and the reference plane SS differs from the distance (second distance D2) between the second surface S2 and the reference plane SS.

Although not illustrated, the feedback coil 42 in a configuration formed by using a series connection in which only the second coil group is used and the first coil group is not used has a resistance common to the feedback coil 42 in the configuration based on the block diagram illustrated in FIG. 9B, but the degree of effect that is exerted on the magnetic detection elements by the canceling magnetic field induced by each configuration is different. Similarly, a configuration of the feedback coil 42 in which the resistance is common to the feedback coil 42 in the configuration illustrated in FIG. 9C but the degree of effect that is exerted on the magnetic detection elements by the canceling magnetic field induced by each configuration is different can be provided by using only the second coil group.

The embodiments described above are provided for easy understanding of the present invention and are not provided with the intention of limiting the present invention. Accordingly, each element disclosed in the above embodiments is intended to include all the design changes and equivalents within the technical scope of the present invention.

For example, in the magnetic balance type current sensor 200, the first surface S1 and the second surface S2 are both located on the Z2 side of the reference plane SS in the Z1-Z2 direction, but this is not meant to be limiting. One of the surfaces may be located on the Z1 side in the Z1-Z2 direction, and the other may be located on the Z2 side in the Z1-Z2 direction. An insulating layer may be formed on coils located farthest from the magnetic detection elements.

In the magnetic balance type current sensor 200, as illustrated in FIG. 6, the first distance D1 for the coil wire sections in the first coil group (the coil wire section 11C and the coil wire section 12C) and the second distance D2 for the coil wire sections in the second coil group (the coil wire section 21C and the coil wire section 22C) are different. In the magnetic balance type current sensor 200, which has such a configuration, when an equal amount of canceling current flows through the coil wire sections in the first coil group (the coil wire section 11C and the coil wire section 12C) and through the coil wire sections in the second coil group (the coil wire section 21C and the coil wire section 22C), the canceling magnetic field having different strength is exerted on the magnetoresistance effect elements G11, G21, G12, and G22 by each coil group, but this is not meant to be limiting. For example, the permeability of a material disposed between the magnetoresistance effect elements G11, G21, G12, and G22 and the coil wire sections in the first coil group (the coil wire section 11C and the coil wire section 12C) and the permeability of a material disposed between the magnetoresistance effect elements G11, G21, G12, and G22 and the coil wire sections in the second coil group (the coil wire section 21C and the coil wire section 22C) may be different. In such a structure, when an equal amount of canceling current flows through the coil wire sections in the first coil group (the coil wire section 11C and the coil wire section 12C) and through the coil wire sections in the second coil group (the coil wire section 21C and the coil wire section 22C), the canceling magnetic field having different strength may be exerted on the magnetoresistance effect elements G11, G21, G12, and G22 by each coil group.

What is claimed is:

1. A magnetic balance type current sensor comprising:
   a magnetic detection element whose characteristics change depending on an induced magnetic field induced by a current to be measured; and
   a plurality of coils each of which includes a coil wire section disposed on a surface located away from a reference plane containing a sensitivity axis direction of the magnetic detection element,
   each of the plurality of coils
      including a lead wire section having one end portion connected to one end portion of the coil wire section, and two electrode sections being individually located at each end of each of the plurality of coils and being electrically connected individually to the coil wire section and to the lead wire section, and
      generating a canceling magnetic field that cancels out the induced magnetic field when a feedback current is passed by using the two electrode sections as an applying section,
   the lead wire sections and the coil wire sections having crossing portions in each of which one of the lead wire sections and one of the coil wire sections are layered with an insulating section interposed so as to overlap each other in a first direction, which is a winding axis direction of the coil wire sections, and
   the two electrode sections being located outside envelope curves of the coil wire sections when viewed in the first direction.

2. The magnetic balance type current sensor according to claim 1,
   wherein, when two coils selected from the plurality of coils are connected in series and the feedback current is passed, strength of the canceling magnetic field that is exerted on the magnetic detection element by one of the two coils is different from strength of the canceling magnetic field that is exerted on the magnetic detection element by the other of the two coils.

3. The magnetic balance type current sensor according to claim 2,
   wherein a first coil group including at least one of the plurality of coils is formed and includes a first coil wire section, and the first coil wire section is disposed on a first surface located at a first distance from the reference plane,
   wherein a second coil group including at least one of the plurality of coils is formed and includes a second coil wire section, and the second coil wire section is disposed on a second surface located at a second distance from the reference plane, the second distance being different from the first distance and the at least one of the plurality of coils included in the second coil group being different from the at least one of the plurality of coils included in the first coil group, and
   wherein, when one coil in the first coil group and one coil in the second coil group are connected in series and the feedback current is passed, strength of the canceling magnetic field that is exerted on the magnetic detection element by the one coil in the first coil group is different from strength of the canceling magnetic field that is exerted on the magnetic detection element by the one coil in the second coil group.

4. The magnetic balance type current sensor according to claim 3,
   wherein the first coil group and the second coil group are both located on the same side of the magnetic detection element.

5. The magnetic balance type current sensor according to claim 3,
   wherein the first coil group includes two or more coils exerting the same degree of magnetic effect on the magnetic detection element, and the second coil group includes two or more coils exerting the same degree of magnetic effect on the magnetic detection element.

6. The magnetic balance type current sensor according to claim 5,
wherein the two or more coils in the first coil group and the two or more coils in the second coil group all have the same resistance.

7. The magnetic balance type current sensor according to claim 1,
wherein at least one of the coil wire sections included in the plurality of coils has a spiral-shaped portion having a winding axis oriented in a direction parallel to the first direction.

8. The magnetic balance type current sensor according to claim 7,
wherein, for each of the plurality of coils,
the coil wire section has figure-of-eight winding viewed in the first direction and has end portions located inside a wound coil wire,
two lead wire sections are included,
one end portion of each of the lead wire sections is connected to a corresponding end portion of the coil wire section, and
the two electrode sections are individually connected to the other end portions of the lead wire sections, and
wherein a plurality of sets of the two electrode sections included in the plurality of coils constitute an electrode array section in which a plurality of electrode sections are disposed side by side when viewed in the first direction.

\* \* \* \* \*